United States Patent [19]

Dinger et al.

[11] 4,298,810

[45] Nov. 3, 1981

[54] SEMICONDUCTOR DEVICE CONDUCTION STATE DETECTION CIRCUIT

[75] Inventors: Edward H. Dinger, Waynesboro; Allen M. Ritter, Rocky Mount, both of Va.

[73] Assignee: General Electric Company, Salem, Va.

[21] Appl. No.: 111,790

[22] Filed: Jan. 14, 1980

[51] Int. Cl.³ .................... H03K 17/72; G01R 31/26
[52] U.S. Cl. ......................... 307/252 N; 307/252 T; 307/350; 324/64; 324/158 SC
[58] Field of Search ........... 307/200 A, 252 J, 252 N, 307/252 T, 252 UA, 247 R, 350; 324/62, 64, 158 SC

[56] References Cited

U.S. PATENT DOCUMENTS 3,728,557  4/1973  Pelly et al. ..................... 307/252 N
3,793,537  2/1974  Stringer ......................... 307/252 N Primary Examiner—John Zazworsky
Attorney, Agent, or Firm—Arnold E. Renner

[57] ABSTRACT

A circuit for detecting the conductive state of a semiconductor device (e.g., a thyristor) which exhibits a substantial terminal to terminal voltage difference between its conducting and nonconducting states and which utilizes a gating signal to render the device conductive includes a bistable circuit (e.g., a flip-flop) which is placed into a first stable state with the occurrence of the gating signal. A voltage sensing circuit disposed across the semiconductor device is utilized to develop an additional signal which is applied to the bistable circuit to thereby place that latter circuit into its second stable state. The state of the bistable circuit is representative of the conductive state of the semiconductor device.

10 Claims, 4 Drawing Figures

| | FF |
|---|---|
| $t_0 - t_1$ | 0 |
| $t_1 - t_3$ | 1 |
| $t_3 - t_5$ | 0 |
| $t_5 - t_6$ | 1 |
| $t_6 - t_8$ | 0 |

4,298,810

SEMICONDUCTOR DEVICE CONDUCTION STATE DETECTION CIRCUIT

BACKGROUND OF THE INVENTION

The present invention relates generally to sensing circuits and more particularly to improved circuitry for sensing and indicating the conductive state of a semiconductor device.

In many applications of semiconductor devices it is highly desirable to be able to determine the conductive state of the device at all times. For example, when thyristors are used in power conversion systems, knowledge of the conductive state of each of the thyristors at each instant in time is necessary in order to know whether the system is working properly. A thyristor, as is well known, belongs to that group of semiconductor devices which is rendered conductive by the simultaneous application of a forward bias voltage between its anode and cathode and a gating signal applied to a third (gating) electrode. A thyristor is rendered nonconductive (i.e., commutated) by the application of a zero or reverse bias voltage across its anode and cathode for a period of time sufficient to allow conduction to cease.

In the typical thyristor power conversion system, a plurality of thyristors are connected in a bridge arrangement and conversion from alternating current (a.c.) to direct current (d.c.) or d.c. to a.c. is achieved through the proper sequencing of the conductive state of the several thyristors. A common problem with such conversion systems is that, for any of a number of reasons, one or more thyristors of the conversion bridge will either fail to conduct or to commutate at the proper time. Failure to commutate is usually a more serious problem since, if not immediately corrected, one commutation failure or commutation fault often leads to additional commutation failures and soon control of this system is lost and damage to the equipment or injury to personnel could result.

A wide variety of schemes are presently employed to detect the conductive condition of semiconductor devices and hence to determine a potential or existing fault condition. Some of these schemes are fairly elaborate and while providing very good results are also relatively expensive. One of the simpler and more widely used schemes in an a.c. to d.c. conversion system is to sense the voltage across the semiconductor device as an indication of its conductive state to thus determine the existence of a commutation fault. While this basic scheme has the advantage of low cost because sensing of a voltage is a relatively easy and inexpensive procedure, the actual implementation of this basic idea becomes more complex since, although the voltage across the semiconductor device will approach the zero level when the device is conductive, it will also go to zero volts each time the a.c. source voltage goes through zero. Thus, in order to properly implement this scheme, allowances must be made to account for the zero source voltage crossings and to distinguish these zero voltage conditions from those which exist when the semiconductor device is conducting. One way of achieving this is to maintain accurate timing with respect to the a.c. source and not sample the device voltage when the a.c. source is going through zero. A more common method is to take repeated samples of the voltage across the device so that only a substantially zero voltage indication at consecutive sampling intervals will actually be recognized as a conducting semiconductor. These solutions to the basic problem obviously result in a more complex and more costly scheme and tend to reduce the overall reliability of the detection scheme.

SUMMARY OF THE INVENTION

It is, therefore, an object of the present invention to provide an improved semiconductor device conduction state detection circuit.

It is a further object to provide a reliable semiconductor device conduction state detection circuit at a relatively low cost.

It is an additional object to provide a semiconductor device conduction state detection circuit of high reliability but without the need for ancillary dynamic timing circuits.

Still another object is to provide a circuit which gives continual indications of the conductive state of an associated semiconductor device through simple inexpensive circuitry.

The foregoing and other objects are achieved in accordance with the present invention through the use of a detection circuit which senses the anode to cathode voltage of a semiconductor device which exhibits a relatively low anode to cathode voltage when the device is in the conducting state and a relatively high anode to cathode voltage when the device is in the nonconductive state and which device is capable of being rendered conductive in response to the simultaneous application of a positive anode to cathode voltage and a gating signal applied to a gating electrode of the device. A voltage sensing circuit is provided to sense the extant voltage across the anode to cathode device and to provide a signal which is indicative of that voltage. A bistable memory means is responsive in a first instance to the gating signal applied to the device to place the bistable memory means into a first of its stable states. The second input to the bistable memory device is a signal which is the function of the anode to cathode voltage and this signal, when that voltage is of a high value indicating the device is nonconductive, is utilized to place the bistable memory means into its second stable state. Thus, the output state of the bistable means is indicative of the conductive state of the semiconductor device.

BRIEF DESCRIPTION OF THE DRAWING

While the present invention is particularly defined in the claims annexed to and forming a part of this specification, a better understanding can be had from the following description taken in conjunction with the accompanying drawing in which:

DETAILED DESCRIPTION

Figure 1:
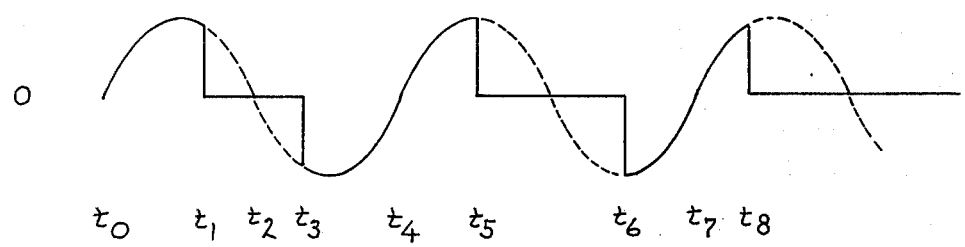
FIG. 1 shows wave forms useful in understanding the present invention.

Referencing first FIG. 1, the dashed line showing illustrates a typical sinusoidal, single phase, a.c. voltage. The heavy line depiction shows the voltage which would exist across a semiconductor device such as a thyristor (which term will be used hereinafter for sake of brevity) which is phase controlled to provide a variable level output voltage. As seen by the solid line depiction of FIG. 1, starting at time $t_0$, the thyristor is not conducting and the voltage across the anode to cathode of that thyristor will be essentially the same as the source voltage until time $t_1$. Time $t_1$ occurs at approximately 120° into the cycle and is the time at which the thyristor is, in this example, fired. With conduction of the thyristor, the voltage between its anode and cathode will drop to essentially zero volts and will continue at that level until it is commutated or turned off. This is shown in FIG. 1 at time $t_3$. A voltage will now exist across the thyristor until time $t_5$ when the thyristor is again fired or rendered conductive. In this half-cycle, conduction is indicated as starting at approximately 90° after the a.c. source voltage crossed zero going in the positive direction. During the period $t_5$ to $t_6$, the thyristor is again conducting while from $t_6$ to $t_8$ the thyristor is nonconducting. The point to be particularly noticed with respect to FIG. 1 is that at certain times the voltage across the thyristor will be at substantially zero volts independently of whether the thyristor is conducting or not. For example, at time $t_2$ the thyristor voltage will be zero as would be expected because the thyristor is conducting. However, at times $t_4$ and $t_7$, the voltage across the thyristor will also be substantially zero volts since the source voltage is zero. Thus, were one to simply look at the voltage, it is evident that a sampling taken at times $t_4$ or $t_7$ would provide an erroneous reading or indication since the semiconductor is not really in the conductive state although there is a zero voltage thereacross.

Figure 2:
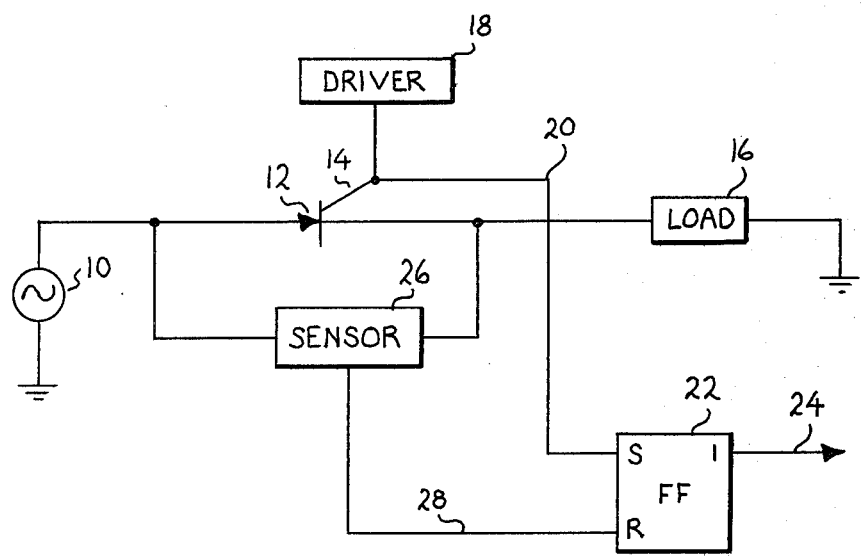
FIG. 2 illustrates the present invention in block form.

FIG. 2 illustrates the present invention in block diagram form. An a.c. source voltage 10 is connected between ground and the anode of a thyristor 12, having a gating electrode 14, which is employed to supply controlled electrical power to a load 16 which is further connected to ground. Thus, in accordance with the known art, the effective voltage applied to the load 16 will be a function of the percentage or the ratio of the on time to the off time of the thyristor as compared to the source voltage. With proper voltage biasing of the anode to cathode of the thyristor 12 and with the application of a suitable gating signal which is shown derived from a driver 18 applied to the gate electrode 14, the thyristor will be rendered conductive. As earlier indicated, thyristor 12 will be rendered nonconductive by the application of a substantially zero or reverse bias voltage applied between the anode and cathode.

As shown in FIG. 2, the gating signal is also applied by way of a line 20 to the S terminal of a bistable memory means shown as a flip-flop 22. Thus, when the gating pulse is applied to the thyristor 12, flip-flop 22 will be placed into its set state such that there appears on its output line 24 a binary signal of a first level; e.g., a binary 1. A suitable voltage sensing circuit 26, capable of providing a high level output signal of a suitable magnitude to its output line 28, is connected by that line to the reset or R terminal of the flip-flop 22 such that when the sensor 26 senses a voltage of a magnitude greater than that which would be experienced when the semiconductor device or thyristor 12 is in the conducting state there will appear on line 28 a signal to place the flip-flop in the reset state. In the reset state, the output signal on line 24 will be the opposite in binary nature to that of the set state; e.g., a binary 0. Thus, it is seen that with each occurrence of a gating signal, the flip-flop 22 will assume one binary state and when a voltage appears across the thyristor indicating that the thyristor has commutated, the flip-flop will assume its second state to thus provide an indication on output line 24, the conductive state of the semiconductor device.

Figures 3, 4:
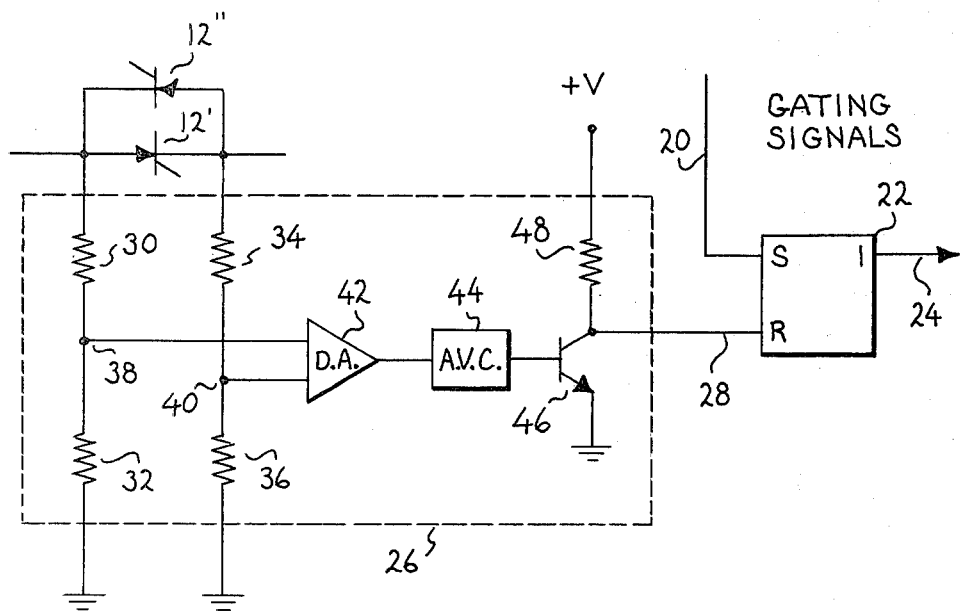
FIG. 3 is a chart used in explaining the operation of the present invention; and, FIG. 4 is a schematic diagram illustrating in detail the preferred implementation of the present invention.

FIG. 3 illustrates in tabular form the output state of the flip-flop 22. With reference to FIG. 1, it is seen that between times $t_0$ and $t_1$, the flip-flop will have a binary 0 output. From times $t_1$ to $t_3$ the output will be a binary 1 while from $t_3$ to $t_5$ it will be a binary 0. From $t_5$ to $t_6$, the thyristor is again conducting and the output will be a binary 1 and at $t_6$ to $t_8$, after the thyristor has commutated, the output will be 0. The important thing to note here is that the output of the flip-flop is always indicative of the conductive state of the thyristor and is not affected by zero crossings of the source voltage. This is best seen by comparing FIGS. 1 and 3. As earlier indicated, the prior art can provide a false indication at times $t_4$ and $t_7$ (FIG. 1) whereas the present invention, as shown by the table of FIG. 3, provides a correct indication at all times. Thus, it is seen that there has been provided a relatively simple, inexpensive circuit for determining the output state of the thyristor which circuit is not affected by the zero crossings of the source voltage.

FIG. 4 illustrates in greater detail one possible implementation of the invention in accordance with the preferred embodiment although it is to be expressly understood that other specific implementations could be utilized with equal facility. As shown in FIG. 4, two antiparallel connected thyristors 12' and 12" are shown to indicate the state of the art circuitry for providing bidirectional power to the load 16. Within the dashed line block 26 are shown the details of the sensor 26 of FIG. 2. A first voltage divider comprised of resistors 30 and 32 is connected between one juncture of the two thyristors 12' and 12" and ground. A second voltage divider consisting of resistors 34 and 36 is similarly connected between the other junction of the two thyristors and ground. The two voltage dividers are used simply to develop signals with respect to a reference point (e.g., ground) which are of suitable magnitude to be utilized. Thus, there appears between the midpoints 38 and 40 of the two voltage dividers a voltage proportional to the voltage across the thyristors 12' and 12". The two points 38 and 40 are connected to a differential amplifier 42 which may be of any suitable type, such as one comprised of operational amplifiers, to thus provide at its output a signal which is either zero, of a high positive value or of a high negative value in accordance with the value and relative polarity of the voltage across the thyristors. This signal from the differential amplifier 42 is applied to an absolute value circuit 44, which may be of any of those common in the art, which provides a positive output voltage signal for application to a suitable switching circuit. The switching circuit is comprised of a transistor 46 having its emitter connected to ground, its collector connected by way of a resistor 48 to a suitable voltage potential $+V$, and its base connected to receive the output signal from the absolute value circuit 44.

The collector of transistor 46 is connected as the output of the sensor and the collector voltage and is applied by way of line 28 to the R terminal of the flip-flop 22. As was earlier indicated with respect to FIG. 2, the flip-flop 22 also receives the gating signals, in this case the gating signals applied to either of the thyristors, by way of line 20 at its S or set terminal to thus cause the flip-flop to assume the states in accordance with the description of FIG. 2.

Thus, it is seen that there has been provided a simple and very inexpensive way of accurately determining the conductive state of a semiconductor device such as a thyristor.

While there has been shown and described what is at present considered to be the preferred embodiment of the present invention, modifications thereto will readily occur to those skilled in the art. It is not desired, therefore, that the invention be limited to the specific arrangement shown and described and it is intended to cover in the appended claims all such modifications as fall within the true spirit and scope of the invention.

What is claimed is:

1. A conduction state detection circuit for use with a thyristor responsive to an applied forward bias voltage and a gating signal to enter the conductive state comprising:
   (a) bistable memory means responsive to first and second input signals to generate an output signal having a state indicative of the conductive state of said thyristor;
   (b) means for supplying the gating signal for said thyristor to said memory means as said first input signal whereby said memory means is placed in a first of its bistable states and said output signal is of a first state; and,
   (c) sensor means for sensing the voltage across said thyristor and for providing an output signal serving as said second input signal whereby said memory means is placed in a second of its bistable states and said output signal is of a second state.

2. The invention in accordance with claim 1 wherein said bistable memory means comprises a flip-flop having first and second inputs for receiving, respectively, said first and second input signals.

3. A conduction state detection circuit for use with a thyristor having an anode, a cathode and a gate electrode and responsive to the simultaneous application of a forward bias voltage between its anode and cathode and a gating signal to its gate electrode to enter the conductive state comprising:
   (a) bistable means responsive to first and second input signals to provide an output signal having first and second states indicative of the conductive state of said thyristor;
   (b) means for supplying said gating signal as said first input signal to said bistable means whereby said bistable means is placed in the first of its bistable states to thereby provide an output signal of a first state; and,
   (c) sensor means for sensing the magnitude of the voltage between the anode and cathode of said thyristor and for providing, when that voltage is relatively high, said second input signal to said bistable means for placing said bistable means in its second bistable state.

4. The invention in accordance with claim 3 wherein said bistable means includes a flip-flop having first and second inputs for receiving, respectively, said first and second input signals and at least one output for providing said output signal.

5. The invention in accordance with claim 3 wherein said sensor means comprises:
   (a) first and second resistor means for developing first and second voltage signals indicative, respectively, of the voltages at the anode and cathode of said thyristor;
   (b) amplifier means responsive to said first and second voltage signals and operable to provide a difference signal proportional to the voltage difference therebetween; and,
   (c) means responsive to said difference signal to develop said second input signal for application to said bistable means.

6. The invention in accordance with claim 5 wherein said means responsive to said difference signal comprises:
   (a) absolute value circuit for developing an absolute signal of a prescribed polarity and of a magnitude proportional to said difference signal; and,
   (b) drive means responsive to an absolute signal of a prescribed magnitude for developing said second input signal.

7. A conduction state detection circuit for use with a pair of antiparallel connected semiconductor devices each having an anode, a cathode and a gate electrode and each being individually responsive to the simultaneous application of a respective forward bias voltage between its anode and cathode and a gating signal to its gate electrode to render said semiconductor device conductive comprising:
   (a) bistable means responsive to first and second input signals to provide an output signal indicative of the conductive states of said semiconductor devices;
   (b) means for supplying, as said first input signal to said bistable means, the gate signals furnished to said semiconductor devices; and,
   (c) sensor means for sensing the magnitude of the voltage across each of said semiconductor devices and for providing, in response to a voltage magnitude in excess of a prescribed value, said second input signal to said bistable means, said sensor means including:
      (1) resistor means for developing voltage signals proportional to the anode and cathode voltages of said semiconductor devices,
      (2) means responsive to said voltage signals to provide a difference signal proportional to the difference between said voltage signals,
      (3) an absolute value circuit for providing an absolute signal having a predetermined polarity and a magnitude proportional to the value of said difference signal, and,
      (4) driver means responsive to a prescribed value of said absolute signal for generating said second input signal to said bistable means.

8. The invention in accordance with claim 7 wherein said bistable means comprises a flip-flop.

9. The invention in accordance with claim 7 wherein said driver means comprises a transistor having an emitter, collector and base and wherein said absolute signal is applied to said base to render said transistor conductive.

10. A conduction state detection circuit for use with a semiconductor switching device having an anode, a cathode and a gate electrode and of the type exhibiting a relatively low anode to cathode voltage when in the conducting state and a relatively high anode to cathode voltage when in the nonconductive state and being capable of being rendered conductive in response to the simultaneous application of a positive anode to cathode voltage and a gating signal applied to its gate electrode, said detection circuit comprising:

(a) means to sense the extant anode to cathode voltage of said device and to provide a condition signal indicative thereof;

(b) bistable memory means responsive to first and second input signals to provide an output signal having a binary state dependent upon the last applied input signal;

(c) means to apply said gating signal to said bistable means as said first input signal; and, (d) means to apply said condition signal to said bistable means as said second input signal whereby the state of said output signal of said bistable memory means is indicative of the conductive state of said switching device.

* * * * *